(12) United States Patent
Soodprasert

(10) Patent No.: US 7,947,533 B2
(45) Date of Patent: May 24, 2011

(54) VOID FREE SOLDERING SEMICONDUCTOR CHIP ATTACHMENT METHOD FOR WAFER SCALE CHIP SIZE

(76) Inventor: Narase Soodprasert, Bangkok (TH)

( * ) Notice: Subject to any disclaimer, the term of this patent is extended or adjusted under 35 U.S.C. 154(b) by 707 days.

(21) Appl. No.: 11/865,310

(22) Filed: Oct. 1, 2007

(65) Prior Publication Data

US 2009/0087952 A1    Apr. 2, 2009

(51) Int. Cl.
*H01L 21/00* (2006.01)
(52) U.S. Cl. .................... 438/121; 438/122
(58) Field of Classification Search .............. 438/121, 438/122
See application file for complete search history.

*Primary Examiner* — Steven Loke
*Assistant Examiner* — Kimberly M Thomas
(74) *Attorney, Agent, or Firm* — Narase Soodprasert

(57) ABSTRACT

Methods for attaching the wafer scale semiconductor chip, up to 4 square inch (2.times.2 inchs), are comprises of following steps. Stack assembles following materials from bottom to top. First lower integrated heat spreader (IHS). Second thermal interface material (TIM). Third semiconductor chip with backside metallization deposit. Forth polyimide film. Fifth the dummy upper IHS. Then put the stack-assembled set into the metal box and fix in place. Then the metal box and stack-assembled set in it are heated to wetting temperature of TIM. During cool down, the environment temperature must be set at a few degrees lower than the melting point of TIM, to soak the stack-assembled set at melting point of TIM until the TIM completely become solid, then cool down to room temperature. After de-assemble and remove upper IHS and polyimide film, we will get the void free soldering of semiconductor chip on lower IHS.

13 Claims, 2 Drawing Sheets

VOID FREE SOLDERING SEMICONDUCTOR CHIP ATTACHMENT METHOD FOR WAFER SCALE CHIP SIZE

BACKGROUND

1. Field of the Invention

The present invention relates to a method for mechanically and/or electrically and/or thermally attaching a semiconductor chip onto integrated head spreader (IHS), with thermal interface material (TIM), such as solder preform alloys. More particularly void free soldering semiconductor chip attachment that the chips size is extra-large to wafer scale. For present invention, it is up to 4 square inch (2.times.2 inchs).

2. Description of the Related Art

Semiconductor wafer diameter is now up to 12 inch. Then wafer will be cut to individual chips or dies, usually no larger than about 0.5.times.0.5 inchs. Then chips is attached onto support, such as print circuit board (PCB), lead frame, ceramic substrate, flex, integrated heat spreader (IHS), heat sink, etc. There are many type of chip attach materials and methods, such as silicon epoxy, silver epoxy, silver-glass epoxy, solder paste, solder preform, thermo-compression, ultrasonic chip mounting etc. Soldering attached is selected because of their good heat conduction, high reliability, good electrical conduction, etc. Those attached chips then are assembled through semiconductor manufacturing process, until finish to be integrated circuits (IC's) packages.

Increasing chip size will increase the capacity of IC's, if that chip is the memory. Increase the system communication speed, due to reduce number of chips and chip-to chip communications, if that chip is the processor. Increasing chip size may cause of higher current consumption and/or current density. Then affect to increase the junction temperature of chip. So, we need better cooling system than prior art, to transfer heat away from semiconductor chips to IHS. For present invention the solder preform is used as the chip attach material and thermal interface material (TIM).

The most critical problem of chip attachment is void in solder layer between semiconductor chip and support. The voids significantly increase thermal resistance in the solder material, especially if the void locate directly under the active region, or high current density area on semiconductor chip. Consequently, the increased thermal resistance raises the junction temperature and ultimately leads to premature failure of the semiconductor chip. For wafer scale chip, there is more number of high current density areas on several locations. So, only void free attachment is allowed. However in prior art, even when great care is taken to make the soldering attachment of a relatively small, 0.3.times.0.3 inchs chip, the void is about 20% of attachment area still occur.

In prior art, there are many methods and efforts to eliminate voids. For example work on environment such as, scrub the chip over molten solder, clamp to force down the chip to support, soldering in vacuum and/or pressure environments, soldering in nitrogen and/or hydrogen environment. For example work on solder material such as, use flux-less solder, use low melting temperature solder, use liquid solder, use thin solder, deposit or coat solder directly onto backside of chip and/or IHS, etc. Also there is some embodiment work to control rapid cool down rate. But above or some combination of above methods, may not capable to eliminate void for wafer scale semiconductor chips.

SUMMERY OF THE INVENTION

The present invention provides void free soldering semiconductor chip attachment method for wafer scale chip size, up to 4 square inch (2.times.2 inchs). Methods comprise of following steps. Stack assembles following materials from bottom to top. First lower integrated heat spreader (IHS), for present invention that is metal plate (NiAu, is for example) on Cu base coupon. Coupon size is a little bit bigger than semiconductor chip size. Second thermal interface material (TIM), for present invention that is the solder preform, which has the same size as semiconductor chip. Third semiconductor chip with backside metallization deposit (Ti—NiV—Au, is an example). Forth polyimide film. Fifth the dummy upper IHS, that same physical properties as the first lower IHS. Then put and align the stack-assembled set into the metal box and fix in place. The lower part of metal box has pins that the stack-assembled set will be sit on them. Height of all pins is adjustable (and/or later fixed) to control the gap between lower part of metal box and lower IHS. Also there are other pins on upper part of metal box that has the same purpose, to control gap between dummy upper IHS and upper part of metal box.

The metal box including stack-assembled set in it are heated to wetting temperature of TIM. Then during cool down, the environment temperature must be set at a few degrees lower than the melting point of TIM, and soak at that temperature until the molten TIM completely become solid. Then cool down to room temperature. After de-assemble and remove upper IHS and polyimide film, we will get the void free soldering of semiconductor chip on lower IHS.

The assumption of present invention is difference from prior art embodiments. For present invention the voids are not only entrap air or out-gassing. But voids in TIM layer come from rapid cool down the TIM. In solder dipping process or wave soldering process of semiconductor or electronic manufacturing, if we power-off the solder bath and leave molten solder in bath completely become solid, the big holds on surface of solid solder will be appeared, especially around center of solder bath. Occurring of holds is because molten solder does not become solid at the same time. This is also be the cause of void in TIM layer between chip and IHS, in chip attachment process.

Using the dummy upper IHS and metal box is to uniform temperature throughout the stack-assembled set. So, molten solder will not flow. Then molten solder can become solid at the same time throughout mounting area, by setting the environment temperature during cool down at a few degrees lower than the melting point of TIM, and soak until the TIM completely become solid. This feature is especially advantageous in attachment of extra large, wafer scale chips where the mounting surface is part of IHS.

The material properties in an exemplary embodiments of present invention, backside metallization deposit of semiconductor chip is comprised of 100 nm Ti/400 nm NiV/100 nm Au. TIM is SnPb37 solder preform alloy, which has a melting point of 183 C. The surface finished of IHS is NiAu metallization plate on Cu base coupon. Exemplary embodiment is not restricted to other backside metallization materials of semiconductor chips, other comprised of solder TIM alloys, and other metals utilize to plate surface of IHS coupon.

It is preferred that all surfaces subject to attach are free from oxide. So, IHS and/or solder preform TIM may be cleaned with plasma cleaner. And reducing ambient may be applied during storage and during temperature cycle of chip attachment.

These and other features, and advantages, will be more clearly understood from the following detailed descriptions taken in conjunction with the accompanying drawings. The illustrations may not necessarily be drawn to scale, and that there may be other embodiments of present invention, which are not specifically illustrated are not intended as a definition of the limits of the invention.

BRIEF DESCRIPTION OF THE DRAWINGS

The embodiments of invention may be understood by referring to the following description and accompanying drawings that are used to illustrate embodiments of the invention. These drawings depict only typical embodiments that are not necessarily drawn to scale and are not therefore to be considered to be limiting of its scope.

DETAILED DESCRIPTION OF THE INVENTION

Disclosed are embodiments of void free soldering semiconductor chip attachment method for wafer scale chip size to an integrated heat spreader (IHS).

Figure 1:
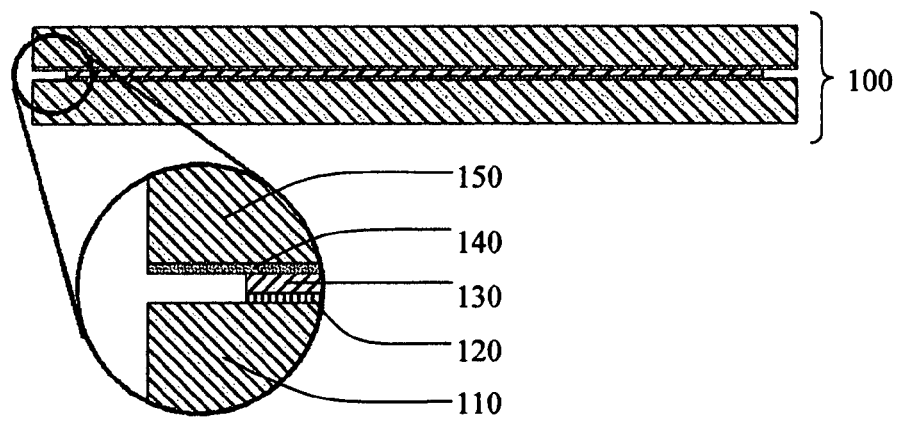
FIG. 1 is cross section view of stack-assembled set.

FIG. 1 according to one embodiment is a cross section view illustrating the preparation of stack-assembled set (100). The lower IHS (110) is the NiAu plate on Cu coupon. Plating is at least on specific mounting area that future attached with TIM and chip. The SnPb37 solder preform TIM (120) is place over lower IHS (110). Surface size of TIM (120) is restricted the same surface size of semiconductor chip (130). The backside metallization surface of chip (130) is face down to TIM (120). The active surface of semiconductor chip (not shown) is face up. So, TIM (120) disposed between the chip (130) and IHS (110). Then align and position (using an alignment frame for precision positioning, if necessary) the TIM (120) and chip (130), fit to the specific mounting area on lower IHS (110). Then place the polyimide film (140) and the dummy upper IHS (150). The Polyimide film is disposed between the active surface of the chip (not shown), and dummy upper IHS (150). The illustrated embodiment, the stack-assembled set (100) comprises of lower IHS (110), TIM (120), Chip (130), polyimide film (140), and dummy upper IHS (150).

An embodiment of preparation stack-assembled set (100) is not restricted to use other equivalent materials for IHS (110 and 150), TIM (120), chip (130) and polyimide film (140). And also is not restricted to select other metals for surface finish deposition or plating of IHS (110 & 150), and/or chip (130), and/or TIM (120).

The functions of IHS (110) are to spread heat from the TIM (120) and chip (130), then conduct away during integrated circuit is under operating, and to uniform the temperature through backside metallization surface of chip (130), during temperature cycle of attachment. While dummy upper IHS (150) is to uniform the temperature through active surface of chip (130). The lower IHS (110) may be laterally attached to other additional components (e.g., a heat sink, a multi-fin heat exchanger, a heat pipe, a second thermal interface, a liquid cooling system, etc.). The IHS (110 and 150) may be constructed from any suitable conductive material such as, for example, Cu and Cu-alloys, Al, AlSiC, CuW, etc. In additional, other metals for surface treatment of IHS (110 and 150) such as, for example, Ni, Au, Ag, Sn and Pd, etc. are applicable. For present invention the size of IHS (110 and 150) is a little bigger than chip (130) size. It is 2.1.times.2.1 inchs. With 0.125 inch thick.

The functions of TIM (120) are including thermally and/or electrically and/or mechanically couple the IHS (110) to the chip (130), conduct heat away from the chip (130). It also functions as protector of chip (130) from the electromagnetic interference (EMI), shield, electrical grounding, and be the mechanical shock absorber.

The TIM (120) may comprise any suitable flux-less capable solder preform materials. In one disclosed embodiments are not restricted to use other solders or solder alloys materials such as for example, SnPb, SnPbAg, SnAu, SnIn, InPb, BiGa, BiSnIn, BiSnSn, or higher order metal composition, or low melting point solder, or lead free solder, etc. The TIM (120) may be deposited, plating, sputtering, evaporation, e-beam, or other known deposition methods, onto the mounting area of IHS (110) and/or backside metallization of semiconductor chip (130), resulted that the TIM (120) may not necessary, but need for ultra-flat mirror polished IHS (110).

The thickness of TIM (120) is normally less than 10 mil (In approximate 7 mil for present invention). But thin at 3 mil or less is also applicable. The thin preform may result in difficult handling, and the thicker preform may result in float and squeeze out of molten solder from mounting area during temperature cycle of attachment. The one important benefit of reduces the thickness of TIM (120), is result to reduce thermal resistivity. The solder TIM (120) and/or IHS (110) may need to be cleaned with plasma cleaner or sputter-etching pre-clean in addition, to remove oxidation layer before assembled, depend on the degree of built up oxidation on surface during storage.

In one embodiment, the wafer scale size semiconductor chip (130), has backside metallization of TiNiVAu, but do not restricted to use other equivalent materials such as for example, uses TiN, Ta, or TaN instate of Ti. And uses Ni instate of NiV. And uses Pt or Pd instate of Au. The active surface (opposite to backside metallization) of chip (130) has many electronic circuit and electrode pads (not shown). The electrode pads may be formed with metal connectors (e.g., solder balls). For the present invention TIM (120) and chip (130), have the same surface dimension that is 2.times.2 inchs.

The polyimide film (140) of embodiment invention, is silicone single coated polyimide tape (product code YT-130 of Houston Packing Mfg. Limited.). It is the thin thermal silicone adhesive tape. Typical thickness is 2.5 mil. The polyimide film is stick on bottom surface of dummy upper IHS (150). Purpose to prevent direct contact of dummy upper IHS (150) to active surface of chip (130), but do not purpose to obstruct heat exchange between dummy upper IHS (150) and chip (130). So in another embodiment is preferred to stick small piece of tapes, on all corners of dummy upper IHS (150). Also, present invention is not restricted to use other silicone materials or materials, if it serve above descriptive purposes.

Figure 2A:
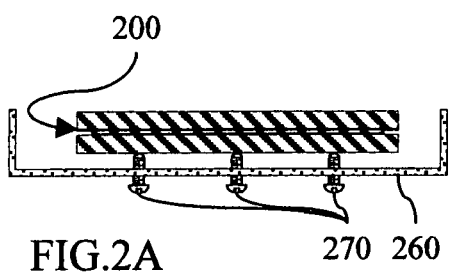
FIG. 2 is schematic diagrams illustrating embodiment steps of align and fix the stack-assembled set into metal box.
Figure 2B:
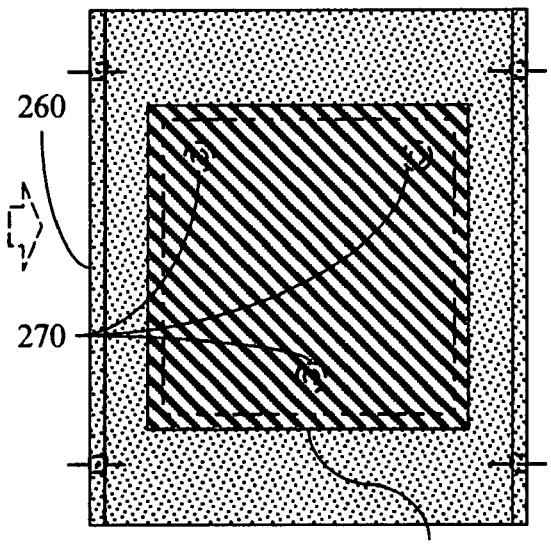
Figure 2C:
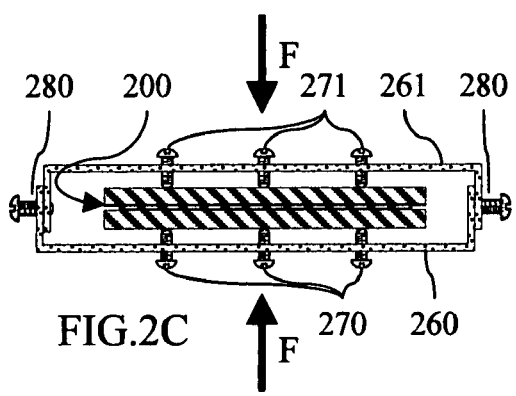
Figure 2D:
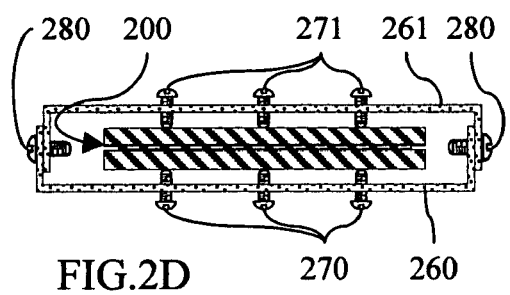
Figure 2F:
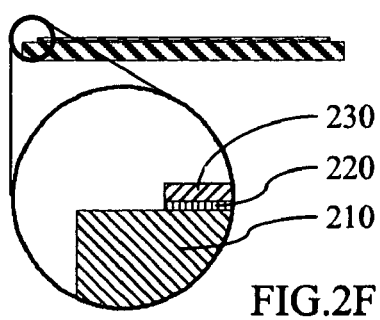
Figure 2E:
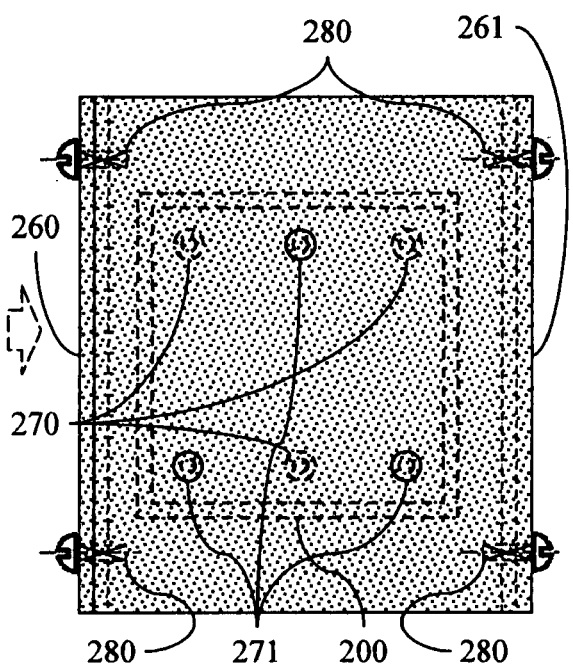

FIG. 2 shows placing and fixing the stack-assembled set (200) into the metal box, as illustrated in FIG. 2A to 2F. FIG. 2A shows placing the stack-assembled set (200) on the lower screw pins (270) of lower part of metal box (260). While FIG. 2B is top view, shows the size of metal box in comparison to stack-assembled set (200), and also show position of lower screw pins (270). FIG. 2C shows placing the upper part of metal box (261) on top surface of stack-assembled set (200). So, the tips of upper screw pin (271) of upper part of metal box (261) touch to upper surface of stack-assembled set (200). The force is applied on upper part of metal box (261) and then tightens the clamp screws (280). The compression force insures adequate contact among all parts of stack-assembled set (200) together. FIG. 2D shows complete fixing of stack-assembled set (200) in metal box. While FIG. 2E is top view, shows the position of upper screw pins (271) and clamp screw (280). FIG. 2F shows the final configuration of semiconductor chip (230) firmly attached to the mounting area of IHS (210) by solder TIM (220), with essential void free in TIM (220) layer.

The metal box (260 and 261) are high thermal conductive metal. For this invention, Al sheet thickness 50 mil is used, but not restrict to use other thickness or other metals, such as Cu or CuZn (Brass), etc. One purpose of metal box is to uniform temperature between lower and upper surface of stack-assembled set (200), during attachment. Uniform of temperature is result of fix and bridge the lower part of metal box (260) to the upper part of metal box (261), with clamp screw (280), as shown in FIGS. 2D and 2E. During initial set up for temperature profile, the height of screw pins (270 and 271) are adjustable to control the gap between top and bottom surface of stack-assembled set (200) and inner surface of metal box (260 and 261), then the temperature offset will be all eliminated. The height of screw pins (270 and 271) may latterly be fixed after get the uniform temperature profile from initial set up. There is no force (F) applied on stack-assembled set (200) that shown in FIG. 2D, during temperature cycle of attachment. For this invention, to control distant between lower IHS (110) and chip (130) by above setting descriptions are applied instate of force application in prior arts. Than the final desired uniform bond-line thickness of solder TIM (220), when chip (230) has been secure attached to IHS (210).

FIGS. 2D and 2E shows the complete set up of stack-assembled set (200) in metal box (260 and 261). It will be passed to temperature cycle of attachment. The suitable heat source may be the dynamic programmable oven, conveyor type of gravity convection oven or mechanical convection oven, etc. The conduction oven is not recommended because it may result to not uniform temperature between top and bottom surfaces of stack-assembled set under heat. In oven's chamber, the reducing environment is preferred, especially if the active surface of semiconductor chip has no oxidation protective coating layer (such as thin gold layer).

Figure 3:
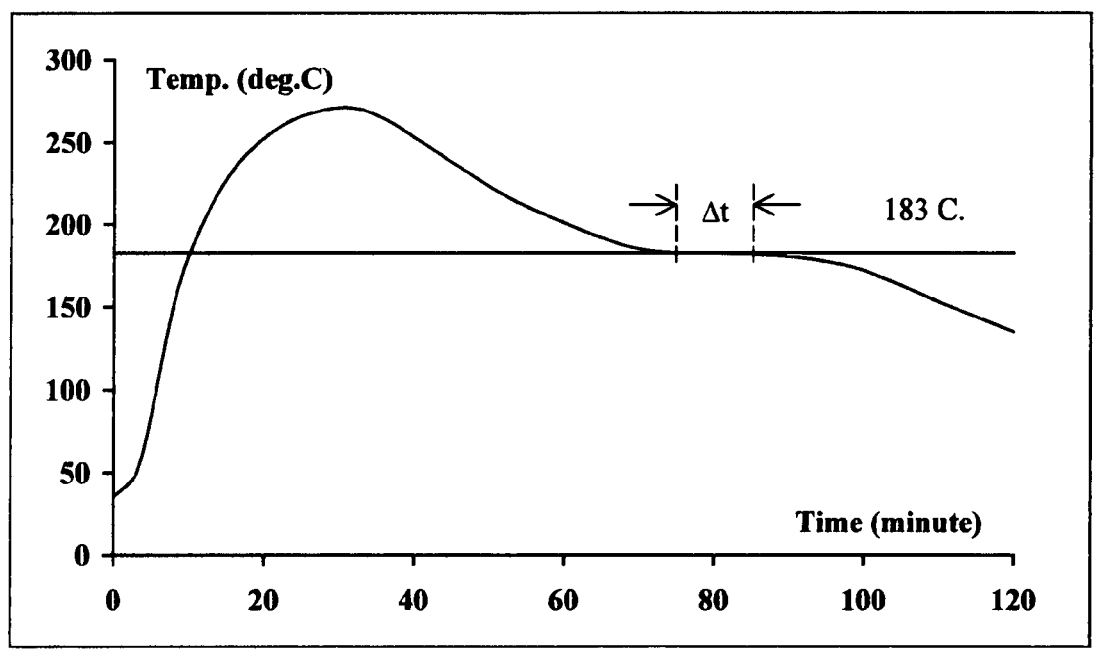
FIG. 3 is temperature profile of present invention.

FIG. 3 shows temperature profile of one embodiment invention. The temperatures on top and/or bottom surface of stack-assembled set (200), shown in FIG. 2, are measured. Consider on rise up temperature section of profile (shown in FIG. 3), the oven heat up the metal box (260 and 261), then heat is transferred to top and bottom surface of stack-assemble set (200). The temperature is uniformed through stack-assembled set (200), all along the period of temperature cycle of attachment. Because present invention is flux-less process, so the preheat step is not required. The oven just heats up to increase temperature from room temperature pass to melting point of solder, to solder wetting temperature and then to peak temperature.

For fast rise up rate, solder TIM (220), may not be molten at the same time through the piece of TIM (220). The molten solder TIM (220) fill and squeeze air between chip (230) and lower IHS (210), out from the mounting area, due to surface tension of molten solder. While distance between chip (230) and lower IHS (210) still be kept constant at the thickness of TIM (220), due to fixing of metal box (260 and 261) with pins (270 and 271) and screw (280).

The peak temperature at higher than 250 C. is much higher than 183 C., which is the melting point of SnPb37 solder TIM (220). The peak temperature is also higher than 232 C., which is the melting point of Sn. While the melting point of Pb is 327 C. Higher peak temperature than melting point of Sn is to improve wetting ability of flux-less solder.

In prior art, after rise up the unit under soldering to peak temperature, the unit under soldering normally rapidly cool down to room temperature as fast as possible. This is one cause of void especially at the center of solder TIM. Because the center of molten solder has highest temperature, so molten solder around the edge of semiconductor chip has frozen before center. The bond line thickness of solder layer is fixed while the solder at center still molten. During molten solder at center come to be solid, the shrinkage of solder due to surface tension and thermal expansion properties of solder, will pull the volume of molten solder away from center, result to void in solder layer especially at center of it.

One embodiment of this invention is adding the soak period (Δt shown in FIG. 3), during cool down at the melting point of TIM (220). By setting the environment temperature during cool down at a few degrees lower than the melting point of TIM (220), and soak until the TIM (220) completely become solid. This feature is especially advantageous in attachment of extra large wafer scale chips where the mounting surface is part of IHS. Then molten solder can become solid at the same time throughout mounting area.

The cycle time depends on many factors. One embodiment in this invention is more than 90 minutes. For future improvement, the consumptive time can be reduced if the following factors are optimized. The higher heat capacity oven can reduce the rise up rate. The higher thermal conductive material of metal box (260 and 261), higher thermal conductive material of IHS, lower heat capacity of IHS, and lower gap between metal box (260 and 261) and stack-assembled set (200), can reduce both rise up and cool down time. Vacuum and reducing cooling ambient can reduce cool down time. So consume time will be reduced.

Less soak time (Δt shown in FIG. 3), is required for less mass and/or volume of solder TIM. Because the less mass of solder need less time to release the hidden heat of molten solder. That explain why soaking at melting temperature of solder TIM is not necessary, in prior art. For small size of semiconductor chip and little mass and/or volume of solder TIM, the rapid cool down to room temperature is applicable.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A method for attaching a semiconductor chip to a lower integrated heat spreader comprising the step of:
   assemble a stack-assembled set comprises stacking the following elements from bottom to top,
   a lower integrated heat spreader, a thermal interface material, a semiconductor chip, a polyimide film and a dummy upper integrated heat spreader;
   then placing the stack-assembled set into a metal box and fixing the stack-assembled set in place;
   heating the stack-assembled set in the metal box to above wetting temperature of the thermal interface material;
   then cooling down the stack-assembled set with a soak to the melting point of the thermal interface material for a period of time until the thermal interface material is completely solid;
   then cooling down the stack-assembled set to room temperature; then removing an upper part of the metal box, the dummy upper integrated heat spreader and the polyimide film.

2. The method of claim 1, wherein the lower integrated heat spreader, and the dummy upper integrated heat spreader are comprised of the same conductive material.

3. The method of claim 2, wherein the lower integrated heat spreader and the dummy upper integrated heat spreader have a larger surface area than the semiconductor chip.

4. The method of claim 1, wherein the thermal interface material comprises a solder material.

5. The method of claim 4, wherein the surface size of the thermal interface material is restricted to the same surface size as that of the semiconductor chip.

6. The method of claim 1, wherein semiconductor chip includes an active surface and a backside metallization surface.

7. The method of claim 6, further the backside metallization surface of the semiconductor chip is face down to the thermal interface material.

8. The method of claim 6, further the active surface of semiconductor chip are face up to the polyimide film.

9. The method of claim 6, wherein the semiconductor chip has a surface area of 4 square inches.

10. The method of claim 1, further the thermal interface material and the semiconductor chip, are precisely placed on specific mounting area on the lower integrated heat spreader.

11. The method of claim 1, further the step of placing the stack-assembled set into the metal box comprising: placing the stack-assembled set on a lower part of the metal box; placing an upper part of the metal box on top of the stack-assembled set where the stack-assembled set sits on tips of lower pins of a lower part of the metal box and where the tips of upper pins of an upper part of the metal box touch upper surfaces of the stack assembled set; then forcing the top of the upper part of the metal box to ensure adequate contact among all parts of the stack-assembled set and then fixing together the lower and upper parts of the metal box; then removing the force on the upper part of the metal box after the upper part of the metal box has been fixed with the lower part of the metal box.

12. The method of claim 11, further the height of upper and lower pins are adjustable, to adjust the gap between the surface of stack-assembled set and inner surface of metal box, result to balance temperature between upper and lower surfaces of stack-assembled set.

13. The method of claim 11, comprising compressing the stack-assembled set between the upper pins and the lower pins by attaching the upper pins to the upper part of the metal box and attaching the lower pins to the lower part of the metal box, where the upper part of the metal box and the lower part of the metal box are fixed together.

* * * * *